United States Patent [19]

Lennartz

[11] Patent Number: 5,498,442
[45] Date of Patent: Mar. 12, 1996

[54] FLUIDIZED BED REACTOR AND METHOD FOR FORMING A METAL CARBIDE COATING ON A SUBSTRATE CONTAINING GRAPHITE OR CARBON

[75] Inventor: Jeffery W. Lennartz, Cleveland, Ohio

[73] Assignee: Advanced Ceramics Corporation, Lakewood, Ohio

[21] Appl. No.: 396,875

[22] Filed: Mar. 1, 1995

Related U.S. Application Data

[63] Continuation of Ser. No. 69,801, Jun. 1, 1993, abandoned.

[51] Int. Cl.$^6$ ................. G21C 3/06; B05D 7/00
[52] U.S. Cl. ............... 427/6; 427/213; 427/227; 427/249; 427/255.4; 427/399
[58] Field of Search ............... 427/6, 213, 249, 427/227, 255.4, 399

[56] References Cited

U.S. PATENT DOCUMENTS

| | | | |
|---|---|---|---|
| 3,073,717 | 1/1963 | Pyle et al. | 427/399 |
| 3,089,785 | 5/1963 | Lewis et al. | 117/71 |
| 3,243,349 | 3/1966 | Goeddel | 176/67 |
| 3,247,008 | 4/1966 | Finicle | 117/46 |
| 3,298,921 | 1/1967 | Bokros et al. | 176/67 |
| 3,306,825 | 2/1967 | Finicle | 176/67 |
| 3,312,597 | 4/1967 | Glueckauf et al. | 176/67 |
| 3,325,363 | 6/1967 | Goeddel et al. | 176/67 |
| 3,361,638 | 1/1968 | Bokros et al. | 176/67 |
| 3,369,920 | 2/1968 | Bourdeau et al. | 427/249 |
| 3,442,690 | 5/1969 | Peake et al. | 427/253 |
| 3,649,452 | 3/1972 | Chin et al. | 176/68 |
| 3,650,896 | 3/1972 | Goeddel | 176/68 |
| 3,833,470 | 9/1974 | Gyarmati et al. | 176/68 |
| 4,028,181 | 6/1977 | Huschka et al. | 176/82 |
| 4,267,019 | 5/1981 | Kaae et al. | 176/82 |
| 4,597,936 | 7/1986 | Kaae | 376/411 |
| 4,686,117 | 8/1987 | Arai et al. | 427/249 |
| 4,844,949 | 7/1989 | Arai et al. | 427/213 |

FOREIGN PATENT DOCUMENTS

| | | |
|---|---|---|
| 0176055 | 9/1985 | European Pat. Off. . |
| 161684 | 11/1985 | European Pat. Off. . |
| 96814 | 9/1974 | Japan . |
| 967565 | 8/1964 | United Kingdom . |
| WO8702073 | 4/1987 | WIPO . |
| WO90/11858 | 10/1990 | WIPO . |

OTHER PUBLICATIONS

Carbide Coatings for Graphite, J. M. Blocker, Jr. and I. E. Campbell, pp. 374–378, P/1428 USA (no date).
Coating particles by chemical vapor deposition in fluidized bed reactors, Bernard J. Wood, Angel Sanjurjo, Gilbert T. Tong and Stacy E. Swider, pp. 228–232, Surface and Coatings Technology 49 (1991) (no month).

*Primary Examiner*—Shrive Beck
*Assistant Examiner*—David M. Maiorana
*Attorney, Agent, or Firm*—Eugene Lieberstein; Michael N. Meller

[57] ABSTRACT

A fluidized bed reactor arrangement and method for forming a metal carbide coating on a substrate containing graphite in which a bed of particles inclusive of the substrate is fluidized using a fluidizing gas containing a metal halide vapor formed by reacting a metal halide gas with a carbide forming metal selected from Group IVb through VIIb of the periodic table and maintaining the temperature of the fluidized bed above 1500° C.

5 Claims, 2 Drawing Sheets

FLUIDIZED BED REACTOR AND METHOD FOR FORMING A METAL CARBIDE COATING ON A SUBSTRATE CONTAINING GRAPHITE OR CARBON

This application is a continuation of application Ser. No. 08/069,801, filed Jun. 1, 1993 now abandoned.

This invention relates to a method for forming a metal carbide coating on a substrate containing graphite or carbon using a fluidized bed reactor and to a fluidized bed reactor arrangement for forming a metal carbide coating on a graphite or carbon containing substrate.

BACKGROUND OF INVENTION

Certain metal carbides display exceptional hardness and thermochemical stability. In particular the carbides of hafnium, niobium, tantalum, titanium and zirconium are among the most refractory materials known and are generally stable in severe chemical environments. Coatings of metal carbides have thus found application in the aerospace, nuclear and metallurgical industries. For example, high temperature nuclear reactors use nuclear fuel particles of uranium or oxides of nuclear fuel material which are encased in a protective coating usually of pyrolytic carbon with an outer metal carbide layer. The protective coating has the function of retaining the fuel and fission products during nuclear burn up within the individual particles themselves. The coating must endure the fuel element production and undergo no damage during nuclear burn up. Failure of the coating results in the release of the fission products.

It is known to decompose a hydrocarbon gas such as methane to form a coating of pyrolytic carbon on a substrate in a fluidized bed furnace. It is also known to use standard chemical vapor deposition in combination with a fluidized bed reactor to form a metal coating on particles suspended in the fluidized bed. In this regard fluidized bed systems have been widely used in many industrial applications to form a coating of metal on a substrate. The metal coating formed by the decomposition of a gas forms a mechanical bond at the surface of the substrate which is acceptable for most applications but not in situations where the coating is subjected to extreme environmental conditions particularly in a nuclear reactor. Accordingly, there is an existing need for a method for forming a metal carbide coating which is chemically bonded to the substrate surface and which can withstand the hostile conditions in a nuclear reactor.

A high temperature coating process and apparatus has been developed in accordance with the present invention which combines fluid bed reactor technology with chemical vapor deposition techniques to produce a chemically bonded coating of a metal carbide on a substrate containing carbon or graphite. The carbon or graphite containing substrate may be in the form of particles which are fluidized to form the fluidized bed or may be added to the fluidized bed. The process of the present invention may be used to produce a single or multilayer coating and is particularly suited for forming a dual coating with one layer of pyrolytic carbon and another of metal carbide. Moreover, the metal carbide coating has a uniform thickness with a density substantially close to theoretical density. In accordance with teaching of the present invention particles of nuclear fuel may be encapsulated within a metal carbide diffusion barrier capable of withstanding the condition in a nuclear reactor at temperatures in excess of 2300° C.

SUMMARY OF THE INVENTION

The present invention is a method for forming a metal carbide coating on a carbon or graphite containing substrate in a fluidized bed furnace comprising the steps of:

(a) feeding a fluidizing gas into said furnace to fluidize a bed of particles inclusive of said carbon or graphite containing substrate;

(b) forming a metal halide vapor by reacting a halide gas with a carbide forming metal selected from Group IVb through VIIb of the periodic table;

(c) combining said metal halide vapor with said fluidizing gas; and (d) maintaining the temperature of said fluidized bed at a temperature above 1500° C. to cause said metal halide vapor to chemically react with said carbon or graphite containing substrate for forming said metal carbide coating.

The present invention also relates to a fluidized bed reactor arrangement for forming a metal carbide coating on substrate particles containing carbon or graphite comprising: a vessel; a reaction column vertically supported in said vessel; a gas distributor located at one end of said reactor column; a bed of particles including said substrate particles disposed in said reactor column over said gas distributor; means for introducing a fluidizing gas stream through said gas distributor for fluidizing said bed of particles in said reactor column with said fluidizing gas stream comprising a halide gas; means located upstream of said gas distributor in the path of said fluidizing gas stream for generating a metal halide vapor of a metal selected from Group IVb through VIIb of the periodic table upon contact with said halide gas and heating means for raising the temperature of said vessel to a temperature sufficient to control the temperature of reaction in said reactor column at a temperature of above 1500° C.

BRIEF DESCRIPTION OF THE DRAWINGS

Other advantages of the present invention will become apparent from the following detailed description of the invention when read in conjunction with the accompanying drawings of which.

DETAILED DESCRIPTION OF THE INVENTION

Figure 1:
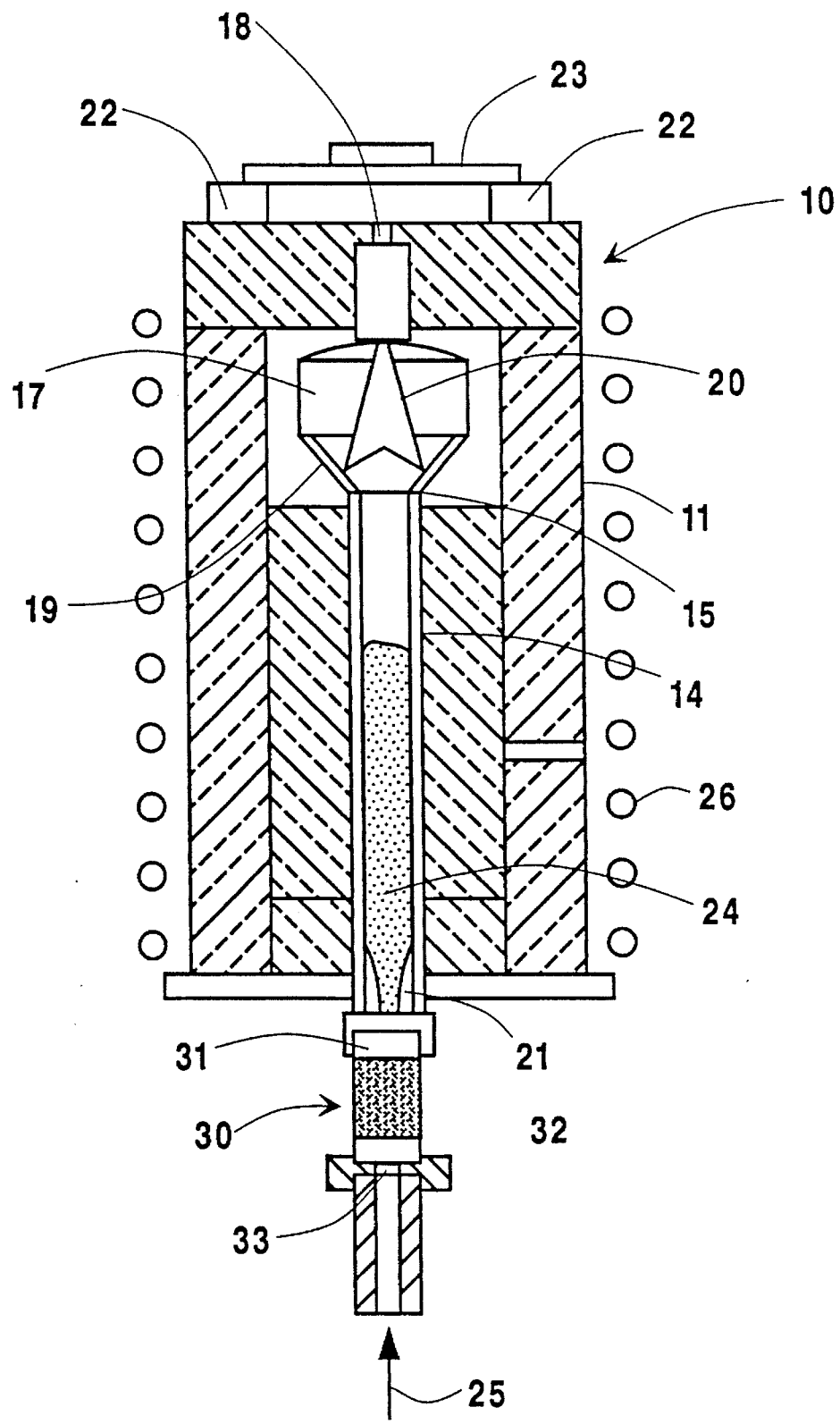
FIG. 1 is a schematic view of fluidized bed reactor furnace used in carrying out the method of the present invention.

Although any fluidized bed reactor may be used to practice the method of the present invention the preferred fluidized bed reactor arrangement is schematically shown in FIG. 1. The reactor 10 comprises a cylindrical vessel 11 surrounding a reactor column 14 which is vertically supported in the vessel 11 with the upper end 15 extending into a disentrainment section 17 which communicates with an exhaust passageway 18. A collection cone 19 in the shape of a funnel extends from the upper end 15 of the reactor column 14 supporting an umbrella shaped particle deflector 20 in the disentrainment section 17. An additional particle deflector 23 is mounted upon supports 22 spaced from the exhaust 18. A gas distributor 21 is mounted in the reactor column 14 at the bottom end thereof. The gas distributor 21 may be represented by a single orifice nozzle as shown in FIG. 1 or by a plate having multiple holes (not shown). A bed of particles 24 is contained within the reactor column 14 above the gas distributor 21 and is levitated by a fluidizing gas stream 25. The reactor 10 is heated by an induction coil 26 surrounding the cylindrical vessel 11.

The bed of particles 24 may comprise particles of any size which the fluidizing gas stream 25 can levitate and may be composed of any material which can sustain a reaction temperature of between 1500° C. and 2300° C. in the reactor column. It is preferable for the bed of particles 24 to be selected as the substrate material upon which a metal carbide coating is formed in accordance with the method of the present invention or, alternatively, to add the substrate to be coated to the bed of particles 24. It is, however, essential to the present invention for the substrate to contain a source of carbon or graphite. The carbon or graphite in the substrate material need not be at the surface of the substrate although an arrangement with carbon or graphite at the surface of the substrate is preferred.

A metal halide vapor generator 30 is connected to the gas nozzle 21 in the path of the fluidizing gas stream 25 upstream of the reactor column 14. The metal halide vapor generator 30 may be located internal or external of the vessel 11 and is preferably in contact with the vessel 11 so that fugitive heat from the reactor 10 will heat the generator 30 to a temperature level sufficient to form a metal halide vapor. The metal halide vapor combines with the fluidizing gas stream 25 and will react with the particle bed substrate in the reactor column 14 in accordance with the present invention for forming a metal carbide coating on any of the bed particles 24 which contains carbon or graphite. The metal halide vapor generator 30 includes a chamber 31 which communicates directly with the gas nozzle 21. The chamber 31 is preferably located 10 to 20 cm beneath the fluidized bed 24. A carbide forming metal 32 selected from Group IVb through VIIb of the periodic table is placed within the chamber 31 and subjected to fugitive heat from the reactor column 14 to form the metal halide vapor. The carbide forming metal 32 placed in the chamber 31 may take any form such as pellets, rod or turnings which in the presence of a halide gas forms a metal halide vapor. A hole 33 in the base of the chamber 31 admits a halide gas such as chlorine to pass therein preferably with the fluidizing gas stream 25. The halide gas may serve as the fluidizing gas stream 25 although a separate inert gas is preferred for use as the fluidizing gas stream 25. A metal halide is formed instantly into a vapor at an appropriate minimum temperature according to the following reactions when subjected to e.g. chlorine gas:

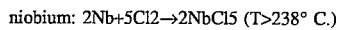

niobium: 2Nb+5Cl2→2NbCl5 (T>238° C.)

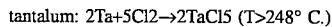

tantalum: 2Ta+5Cl2→2TaCl5 (T>248° C.)

The metal halide vapor is swept downstream with the fluidizing gas stream 25 through the gas nozzle 21 into the reactor column 14. The metal halide should remain as a vapor as long as the temperature is above the metal halide boiling point. The fluidizing gas stream 25 preferably comprises an inert gas such as nitrogen, argon or helium which is supplied from an external source (not shown) although technically the particles 24 in the reactor column 14 may be fluidized entirely by the metal halide gas serving as both fluidizing gas and halide vapor source.

Once metal halide vapor contacts the substrate in the reactor column 14 a reaction will occur to form a metal carbide provided the temperature and pressure conditions are properly controlled to favor solid diffusion of the carbon and graphite in the substrate in accordance with the following overall chemical reaction using, for example, a system of Nb—Cl—C:

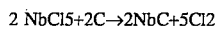

2 NbCl5+2C→2NbC+5Cl2

To favor the above reaction the temperature in the reactor column 14 should be above 1500° C. and preferably in the temperature range of 1700° C. to 2300° C. and the partial pressure of the metal halide reactant should be subatmospheric. The desired partial pressure range for the metal halide reactant is based upon the temperature in the reactor column 14 and may be achieved with a vessel pressure which is atmospheric or subatmospheric based upon the relative dilution ratio between the inert fluidizing gas and the metal halide vapor.

Figure 3:
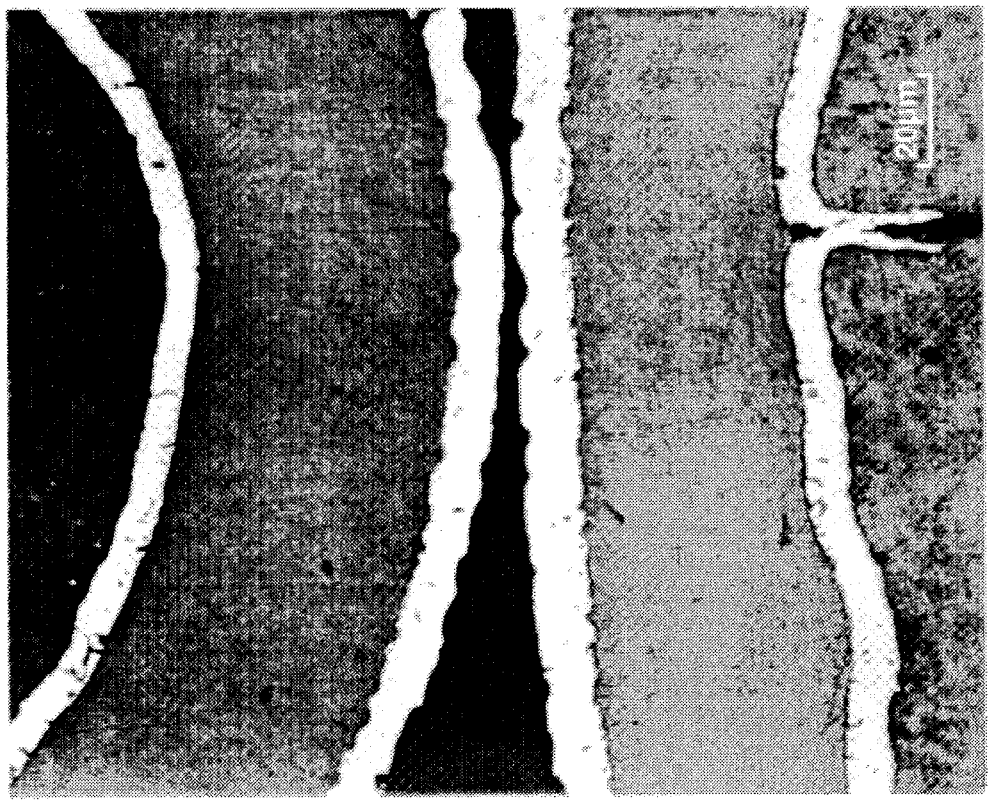
FIG. 3 is another photomicrograph in cross section at a magnification of 500 of a multi-layer coating formed in accordance with the present invention having a tantalum carbide layer and a niobium carbide layer.
Figure 2:
FIG. 2 is a photomicrograph in cross section at a magnification of 400 of a coating with a niobium carbide layer formed in accordance with the present invention.

This process differs from conventional chemical vapor deposition in that the coating incorporates carbon from the substrate and thereby produces a coating which is mechanically and chemically bonded to the substrate. The coating growth rate is based upon by the rate of solid diffusion and as such forms a coating of uniform thickness relative to conventional formed coatings. Any substrate may be used which is compatible with the deposition environment and includes or is composed of carbon, graphite, pyrolytic graphite, and carbon fiber -carbon matrix composites. The substrate of the present invention may include a carbon or graphite base or a matrix of carbon or graphite or a non-carbon based material having a carbon or graphite surface layer. The photomicrographs of FIGS. 2 and 3 show the formation of a niobium carbide coating 2 and a tantalum carbide coating 3 on a graphite substrate 4 with FIG. 2 showing an outer coating 5 of pyrolytic graphite and FIG. 3 showing both a tantalum carbide coating 3 and a niobium carbide coating 6 with an intermediate coating 7 of pyrolytic graphite.

The invention will be described more specifically with reference to the following examples:

EXAMPLE I

About 260 g Nb metal in the form of a rod was placed in the metal halide vapor generator 30. After installation of the fluidized bed reactor assembly ("FBR") an argon inert fluidizing gas was adjusted to a flow of 15 slpm and 131 g (135 cc bulk volume) of graphite particles 100–500 μm in diameter were added to the FBR tube 14. Ar flow rate was readjusted to 11 slpm. The furnace was sealed and purged via the Ar flow. The furnace was then heated to 2050° C. at a partial vacuum of −10 inches Hg. At 2050° C., the furnace was evacuated to 75–100 mm Hg. Chlorine was then admitted through the gas nozzle injector 21 at 0.5 slpm, and the Ar flow rate was reduced to 5.5 slpm. After 3.3 hours furnace power was terminated, the chlorine flow was stopped, and the Ar flow rate was increased to 11 slpm. The furnace was purged for 20 minutes. Vacuum pumps were then isolated, and the system was allowed to pressurize with Ar. Atmospheric pressure was attained in 30 minutes, and a vent line was opened to release Ar The furnace was opened 18 hours later. Six grams of particles were collected from atop the insulation, 34 g from above the collection cone and 104 g from within the FBR tube 14. Photomicrographs of cross-sections showed uniform NbC coatings 8–10 μm thick on the particles retained in the FBR tube.

EXAMPLE II

The FBR assembly was used without a metal halide generator 30 and the Ar flow adjusted to 20 slpm. One hundred four grams (104 g) (78 cc bulk volume) of NbC-coated graphite particles 100–500 μm in diameter were added to the FBR tube. Ar flow rate was adjusted to 17 slpm. The furnace was then heated to 1900° C. at a partial vacuum of 10 inches Hg. When the furnace was stabilized at 1900° C., methane was admitted through the gas injector at 1.4 slpm and the Ar flow rate was reduced to 11 slpm. After 3.2 hours, furnace power was terminated, the methane flow was stopped, and the Ar flow rate was increased to 20 slpm. The furnace was purged for 15 minutes. Vacuum pumps were then isolated, and the system was allowed to pressurize with Ar. Atmospheric pressure was attained in ten minutes, and a vent line was opened to release Ar. The furnace was opened 16 hours later. Seven grams of particles were collected from above the collection cone and 219 g from within the FBR tube. Photomicrographs of particle cross-sections showed uniform PG coatings 55–65 μm thick on the NbC layer from the particles retained in the FBR tube.

EXAMPLE III

About 395 g Ta metal rod was placed in the metal halide generator 30. After installing the FBR assembly on the gas injector 21 and adjusting the Ar flow to 18 slpm, 211 g (190 cc bulk volume) of graphite particles 100–500 μm in diameter previously coated from Examples I and II with NbC and PG was added to the FBR tube. Ar flow rate was adjusted to 14 slpm. The furnace was sealed and purged via the Ar flow. The furnace was then heated to 2050° C. at a partial vacuum of −10 inches Hg. At 2050° C., the furnace was evacuated to 125–150 mm Hg. Chlorine was then admitted through the gas injector at 0.5 slpm, and the Ar flow rate was reduced to 5 slpm. After 4.5 hours, furnace power was terminated, the chlorine was stopped, and the Ar flow rate was increased to 12 slpm. The furnace was purged for ten minutes. Vacuum pumps were then isolated, and the system was allowed to pressurize with Ar. Atmospheric pressure was attained in 2.5 hours, and a vent line was opened to release Ar. The furnace was opened 16 hours later. Thirty-five grams of particles were collected from atop the insulation, 25 g from above the collection cone, and 354 g from within the FBR tube. Photomicrographs of particle cross-sections showed uniform TaC coatings 10–12 μm thick on the PG layer (now 50–55 μm thick) and NbC layer (unchanged).

What is claimed is:

1. A method for forming a metal carbide coating on a carbon or graphite containing substrate in a fluidized bed furnace having a coating chamber in which the coating reaction occurs comprising the steps of:
    (a) feeding a fluidizing gas into said furnace to fluidize a bed of particles inclusive of said carbon or graphite containing substrate;
    (b) forming a metal halide vapor by reacting a halide gas with a carbide forming metal $\underline{M}$ selected from Group IVb through VIIb of the periodic table;
    (c) combining said metal halide vapor with said fluidizing gas;
    (d) maintaining said metal halide vapor in said chamber with said metal halide vapor at a partial pressure which is subatmospheric; and
    (e) maintaining the temperature of said fluidized bed at a temperature above 1500° C. and at the halide vapor partial pressure of step (d) so that said temperature and pressure cause said metal halide vapor to favor a chemical reaction with said carbon or graphite containing substrate in accordance with the following overall chemical equation:

$$2MX+2C \rightarrow 2MC+X_2,$$

wherein M is selected as defined above and X is a halide gas for forming said metal carbide coating.
2. A method as defined in claim 1 wherein said temperature of said fluidized bed in said furnace is maintained in a range between 1700° C. and 2300° C.
3. A method as defined in claim 2 wherein said halide gas is chlorine for forming a metal chloride vapor.
4. A method as defined in claim 3 wherein said subatmospheric partial pressure of said metal chloride is controlled by varying the dilution ratio between said fluidizing gas and said chlorine gas at a given operating vessel pressure.
5. A method as defined in claim 2 wherein said fluidizing gas is selected from the group consisting of nitrogen, argon, helium and a halide gas.

* * * * *